United States Patent [19]

Ho et al.

[11] Patent Number: 5,592,545
[45] Date of Patent: * Jan. 7, 1997

[54] VOICE ENHANCEMENT SYSTEM AND METHOD

[75] Inventors: Helena S. Ho, San Jose, Calif.; Michael K. Pratt, Plano, Tex.; Pong C. Lim, Los Altos; Thomas T. Oshidari, San Jose, both of Calif.

[73] Assignee: DSC Communications Corporation, Plano, Tex.

[*] Notice: The term of this patent shall not extend beyond the expiration date of Pat. No. 5,471,527.

[21] Appl. No.: 484,677

[22] Filed: Jun. 7, 1995

Related U.S. Application Data

[63] Continuation of Ser. No. 161,120, Dec. 2, 1993, Pat. No. 5,471,527.

[51] Int. Cl.$^6$ .................................................. H04M 7/00
[52] U.S. Cl. .......................... 379/347; 379/346; 379/409; 379/406
[58] Field of Search ................... 379/343, 346, 379/394, 398, 404, 400, 401, 406, 409, 410, 347

[56] References Cited

U.S. PATENT DOCUMENTS

| | | | |
|---|---|---|---|
| 3,941,948 | 3/1976 | Brooks | 455/15 |
| 3,993,877 | 11/1976 | Sendyk et al. | 379/355 |
| 4,074,087 | 2/1978 | Blake, Jr. et al. | 379/349 |
| 4,304,968 | 12/1981 | Klausner et al. | 379/69 |
| 4,894,820 | 1/1990 | Miyamoto et al. | 370/32.1 |
| 5,007,044 | 4/1991 | Miyoshi et al. | 379/411 |
| 5,280,525 | 1/1994 | Wesel | 379/400 |
| 5,351,031 | 9/1994 | Henderson | 340/146.2 |
| 5,388,185 | 2/1995 | Terry et al. | 395/2.14 |

OTHER PUBLICATIONS

AT&T Technical Reference 50150 Issue 1.1 Jul. 1993.

*Primary Examiner*—Krista M. Zele
*Assistant Examiner*—Daniel S. Hunter
*Attorney, Agent, or Firm*—Baker & Botts, L.L.P.

[57] ABSTRACT

A telecommunications network (120) is provided with adaptive gain control (AGC) of the voice signals in network (120). Network (120) includes an input (12) for receiving a voice signal, an output (14) for receiving the voice signal, and a coupling between input (12) and output (14) including at least one switch (124) or (126). Network (120) also includes voice enhancer (10) including power averager (18) for measuring and determining the average power of an input signal. Voice enhancer (10) also includes bass band equalizer (16) to attenuate a predetermined portion of the input signal to provide an equalized input signal. From the average power of the input signal is determined a scaling factor from a gain/attenuation look-up table (28). Voice enhancer (10) also includes output scaler (30) coupled to output (14), output scaler (30) scales the equalized input signal with the scaling factor and provides the scaled signal to output (14). Voice enhancer (10) also includes bass to treble power comparator (20) for detecting tandem enhancement and voice-band data detector (22) which cause enhancer (10) to be disabled appropriately.

40 Claims, 3 Drawing Sheets

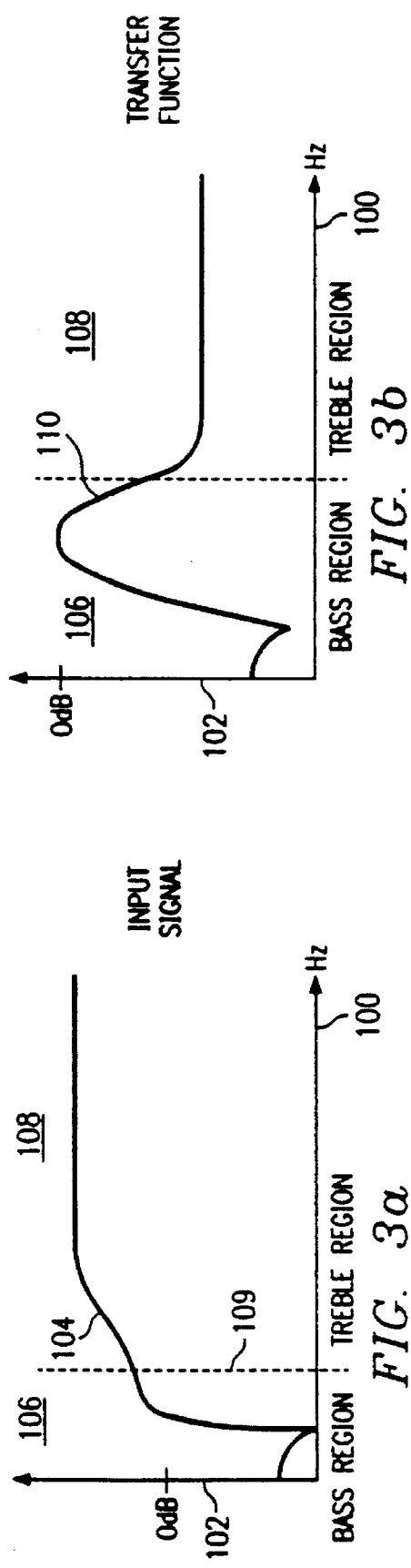
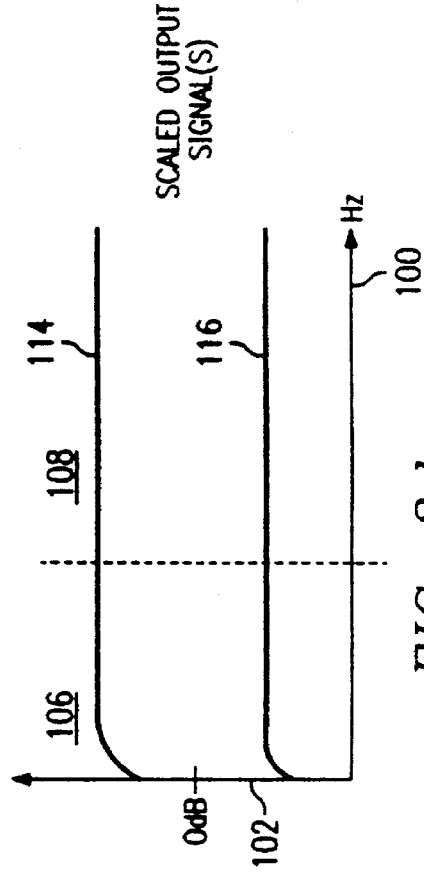
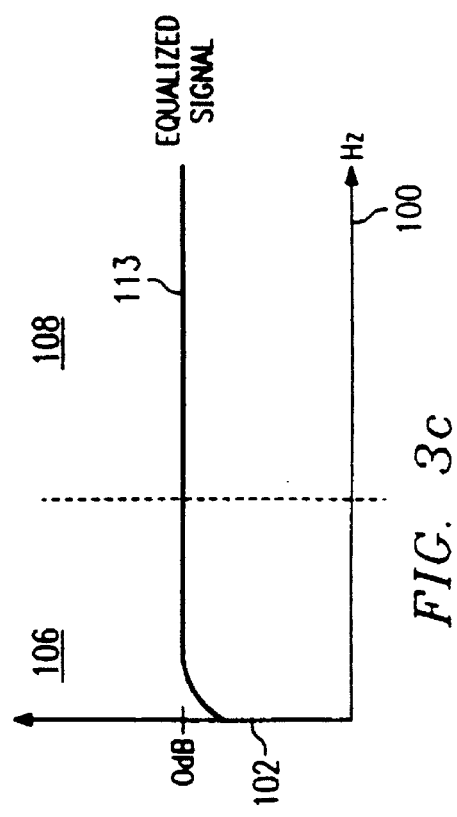

VOICE ENHANCEMENT SYSTEM AND METHOD

CROSS REFERENCE TO RELATED APPLICATIONS

This application is a continuation application of U.S. application Ser. No. 08/161,120, filed Dec. 2, 1993 and entitled "Voice Enhancement System and Method," now U.S. Pat. No. 5,471,527.

TECHNICAL FIELD OF THE INVENTION

This invention relates in general to the field of voice signal processing in a telecommunications network, and more particularly to an improved method and apparatus for enhancing the quality of voice signals in a telecommunications network.

BACKGROUND OF THE INVENTION

Modern telecommunications networks are comprised of input and output devices, e.g., telephone sets, local central offices, and one or more telephone switches which are used for processing voice signals in the network. Voice signals can be characterized as containing two regions, including the bass region and the treble region. The bass region is typically considered to be that part of the voice signal below 300 hertz (Hz), and the treble portion is that part of the signal above 300 Hz. Voice signals may be attenuated in the bass band region by one or more of the elements in a telecommunication network.

The Electronic Industry Association (EIA) standard RS-470, published January 1981, recommends that the input voice signal be attenuated below approximately 300 Hz by the codec in the input telephone station. This attenuation of the amplitude of the bass portion of the input voice signal is recommended because background noises in a telecommunication network lie in the bass region. By decreasing the amplitude of the bass portion of the input signal, the background noises of the network are also diminished.

Additionally, central offices of a telecommunication network may also attenuate the bass band region of a voice signal. Within a central office may be located a channel bank which converts the analog input voice signal to its digital equivalent. The digital voice signal is coupled to the receiving telephone set by a digital telephone switch or switches. Before the signal is provided to the receiving telephone set, it is converted back to analog format at another central office located between the last switch and the receiving telephone set. A channel bank may attenuate the bass portion of the input voice signal during the analog to digital conversion process.

Some networks, therefore, attenuate the bass region of the input voice signal twice; in the input telephone set and in the central office. Attenuation of the bass region of the input signal results in a voice signal at the receiving telephone set that is not a true representation of the speaker's voice. Techniques have thus been proposed to compensate for the loss of bass in a telephone speaker's voice.

One prior approach for providing an enhanced voice signal in a telecommunications network utilizes a fixed gain technique. In the fixed gain approach, the bass portion of the voice signal is amplified while the signal is in the telecommunications network and before it is supplied to the receiving telephone set. This approach compensates for attenuation of the input signal with a fixed gain at some point within the network. This approach also amplifies the previously noted network background noises within the bass band region.

Moreover, if the input voice signal is a loud signal, i.e., the speaker is speaking at a high decibel (dB) level, the fixed gain enhancement approach will further amplify the high decibel signal, thus resulting in a signal at the receiving telephone set which can be uncomfortable to listen to. Alternatively, applying a fixed gain to a high decibel input signal can result in over-driving/saturating different network elements, making the signal less clear than it would have been if the fixed gain had not been applied.

An additional problem associated with the fixed gain technique for voice enhancement occurs when data is transmitted over the telecommunications network in the voice-band. This is becoming a more frequent occurrence for telecommunications systems as the use of facsimile machines and modems coupling computers continues to grow. A modem or facsimile machine transmits voice-band data at a high amplitude and at a high-frequency, e.g., 2700 Hz. Therefore, should the fixed gain technique be applied to a voice-band data signal, it will be unnecessarily amplified, thus resulting in a voice-band data signal that is difficult to use on the receiving end.

Detectors for sensing the transmission of voice-band data have been employed to solve the problems associated with voice-band data transmissions. These detectors are remote to the fixed gain enhancement circuitry, requiring an external control link to the enhancement circuitry for disabling the circuitry. This ensures that the voice-band data is not amplified.

Another problem associated with previously developed voice enhancement systems occurs when an input voice signal travelling in a telecommunications network encounters or must pass through multiple network elements (tandem network) that include fixed gain voice enhancement circuitry. Current fixed gain voice enhancement systems cannot detect when a input voice signal has already been adjusted by the fixed gain technique. Therefore, a voice signal amplified in a first element of a tandem network may be subsequently again amplified by the second element in the network. This additional amplification can result in the saturation of the voice signal, or at a minimum, make the signal uncomfortable to listen to on the receiving telephone set. Also, multiple enhancements to a voice signal can result in oscillation of the voice signal in the tandem network.

SUMMARY OF THE INVENTION

Therefore, a need has arisen for a voice enhancement system which eliminates the problems associated with prior voice enhancement systems.

A need exists for a voice enhancement system which does not amplify the background noise of the telecommunications network during periods of silence on the network.

A need further exists for a voice enhancement system that does not amplify higher level voice signals.

An additional need exists for a voice enhancement system that will not over-drive or saturate higher level voice signals.

A need exists further for a voice enhancement system that detects the transmission of voice-band data without requiring a separate external detector.

A further need exists for a voice enhancement system that works effectively in a tandem network.

An additional need exists for a voice enhancement system that does not cause oscillation of the voice signal.

Therefore, one aspect of the present voice enhancement system prevents the amplification of background noise during periods of silence on the network call.

Another aspect of the present system adaptively changes the amplification of the voice signal so that voice signals of sufficient strength are not amplified.

An additional aspect of the present system ensures that high level voice signals are not over-driven or saturated.

Another aspect of the present invention is that it internally detects the transmission of voice-band data and disables signal enhancement appropriately.

An additional aspect of the voice enhancement system of the present invention is that it can successfully be employed in a tandem network.

Yet another aspect of the present system is that it minimizes opportunity for causing oscillation of the voice signal.

In accordance with the present invention, a voice enhancement system is provided which substantially eliminates or reduces disadvantages and problems associated with prior fixed gain enhancement systems.

A system including the adaptive gain control voice enhancer of the present invention includes an input for accepting voice signals and an output for receiving voice signals with a coupling between the input and output. The coupling includes a voice enhancer which contains a power averager for determining the average power of the voice signal. The voice enhancer also includes an equalizer for attenuating a predetermined portion of the voice signal and an output scaler for scaling the equalized voice signal in response to the determined average power and providing the scaled signal to the output.

Specifically, the voice enhancer of the present invention includes a voice-band data detector and a tandem voice enhancement detector, either of which can disable the voice enhancer appropriately.

A method for providing adaptive gain control with the voice enhancer of the present invention includes determining the average power of an input voice signal, and determining a scaling factor in response to the average power of the input signal. The present inventive method also includes equalizing the input voice signal by attenuating a predetermined portion of the input voice signal. The present method includes scaling the equalized input signal with the determined scaling factor and coupling the scaled voice signal to an output.

More specifically, the present method for providing adaptive gain control voice enhancement includes decoupling the scaled voice signal from the output upon detecting voice-band data or tandem enhancement.

A technical advantage of the adaptive gain control (AGC) voice enhancement system of the present invention is that it provides an enhanced voice signal which sounds more like the speaker's voice. The present adaptive gain control voice enhancement system is compatible with either voice signals or voice-band data signals being transmitted in a telecommunications network.

The present voice enhancement system also provides a technical advantage of eliminating problems associated with currently available fixed gain control voice enhancement systems. The adaptive gain control of the present system attenuates high level input voice signals and amplifies low level input voice signals. The present invention will, therefore, not saturate an input voice signal that is initially at a high level.

An additional technical advantage of the present adaptive gain control voice enhancement system is that it will not amplify periods of silence in a ongoing conversation between remote telephone sets. Therefore, the present system will not amplify network background noise when voice signals are not being transmitted.

Another technical advantage of the present invention is that it is capable of detecting in a tandem network a voice signal which has been previously enhanced. Upon detecting a tandem configuration, the present system disables itself so that a previously enhanced signal is not again amplified. This provides a technical advantage of preventing an oscillation condition of a signal in the network.

Yet another technical advantage of the present system is that it is capable of detecting the transmission of voice-band data and disabling the adaptive gain of the signal as required. The present invention is also self-disabling upon detection of a tandem network or voice-band data and does not require an external control link or detector.

An additional technical advantage of the present invention is that it can be implemented in existing telecommunications equipment, for example in the echo canceller of a network, the present system is also compatible with existing telecommunication networks.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein:

FIGS. 3a through 3d illustrate representative voice signals at different stages of the adaptive gain control process of the present invention;

DETAILED DESCRIPTION OF THE INVENTION

Embodiments of the present invention are illustrated in the FIGURES, like numerals being used to refer to like and corresponding parts of the various drawings.

Figure 1:
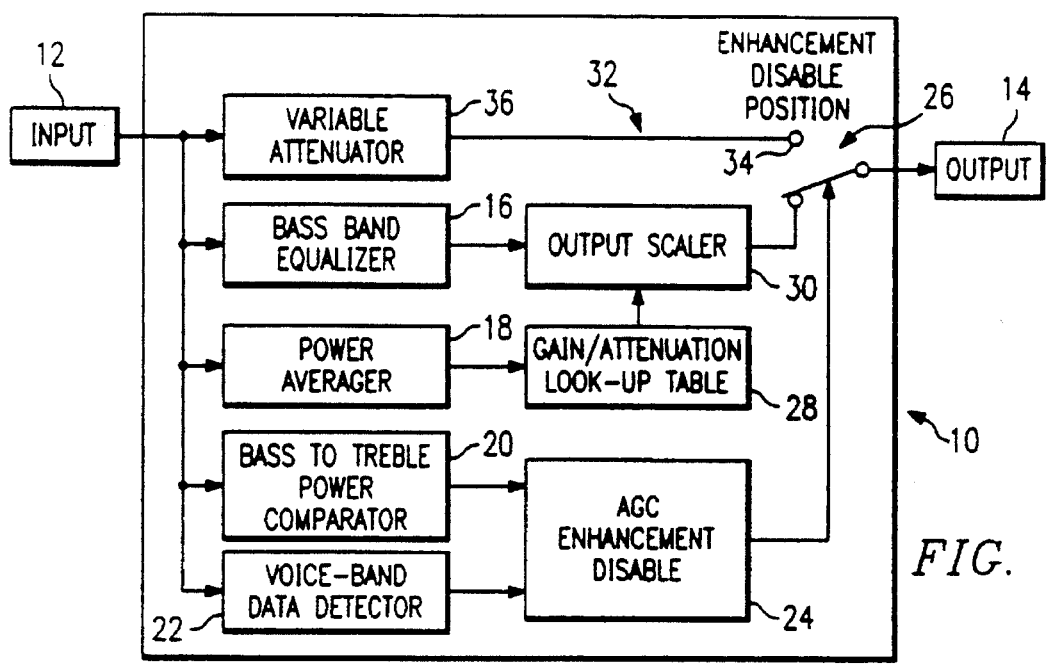
FIG. 1 illustrates a block diagram of the adaptive gain control circuitry of the voice enhancement system of the present invention.

FIG. 1 illustrates a block diagram for implementing the adaptive gain control (AGC) voice enhancement system of the present invention. Voice enhancer 10 of the present invention is coupled to an input 12 and an output 14. Input 12 is typically any device which would provide an input voice signal from a telephone set. Output 14, likewise includes any device used to produce an output voice signal to a telephone set.

Input 12 is coupled in parallel to a bass band equalizer 16, power averager 18, bass to treble power comparator 20, and voice-band data detector 22 on the input side of voice enhancer 10. Bass band equalizer 16 (or equalizer) equalizes an input voice signal by attenuating the amplitude of the treble portion of the input signal. Bass band equalizer 16 can be embodied in a digital filter which decreases the amplitude of the treble portion of an input voice signal. A typical demarcation between the bass and treble regions of the input voice signal is approximately 300 Hz, though other demarcations are possible without deviating from the inventive concepts of the present invention. Bass band equalizer 16 essentially equalizes the bass band distortion of the input signal introduced by an input telephone set and/or from analog to digital conversion of the signal in the channel bank of a central office.

Power averager 18 of voice enhancer 10 measures the average power of an input signal. This is accomplished with a variety of methods, and one embodiment of power averager 18 is a low pass filter through which the rectified input signal from input 12 is passed.

Also included in the input side of voice enhancer 10 is a tandem voice enhancement detector or bass to treble power comparator 20. Bass to treble power comparator 20 detects potential tandem enhancement of an input signal within a telecommunications network. Bass to treble power comparator 20 continually monitors the ratio of bass to treble power of the input signal. It is known that for an average input signal, the bass to treble power ratio is generally within a predetermined range. It is also known that the input telephone set and channel bank of a central office in a network attenuate the bass signal, thereby decreasing this ratio. Bass to treble power comparator 20 continuously monitors this ratio in the input signal. If the monitored bass to treble power ratio is much lower than expected for an enhanced signal then bass to treble power comparator 20 discerns that no tandem enhancement circuit is present. Conversely, if the monitored power ratio is comparable or higher than expected, then bass to treble power comparator 20 discerns that a tandem voice enhancement circuit is present. Bass to treble power comparator 20 provides a technical advantage of detecting when an input voice signal has been previously enhanced so that voice enhancer 10 can be used in tandem networks.

Voice-band data detector 22 also analyzes the input signal. Voice-band data detector 22 determines whether the input voice signal is voice-band data. Voice-band data detection methods are well known in the art and will not be elaborated here. Voice enhancer 10 incorporates one of the prior art methods of detection so that the adaptive gain control of the input signal can be disabled when voice-band data is detected. Voice-band data detector 22 provides a technical advantage of detecting the transmission of voice-band data internally to voice enhancer 10 without requiring external control links and detectors.

Coupled to bass to treble power comparator 20 and voice-band data detector 22 is AGC enhancement disable 24. Based on the inputs of bass to treble power comparator 20 and voice-band data detector 22, AGC enhancement disable 24 determines whether voice enhancer 10 should be disabled by switch 26. The default position of switch 26 enables voice enhancement of the input signal, and will be disabled when AGC enhancement disable 24 determines that either the input signal has been previously enhanced or that the input signal is voice-band data.

Gain/attenuation look-up table 28 is coupled to power averager 18. Once the average power of an input signal is determined at power averager 18, a signal representative of the average power is sent to gain/attenuation look-up table 28. Gain/attenuation look-up table 28 contains scaling factors that are applied to the input voice signal within the inventive concepts of the present invention. Gain/attenuation look-up table 28 is organized such that if the average power of the input signal is high, then the corresponding scaling factor is low. This provides a technical advantage of preventing the over-amplification of high level signals and prevents over-driving or saturating the signal.

The scaling factor can be less than unity if the average power of the input signal is sufficiently high. If the average power of the input signal is measured to be low, then the corresponding scaling factor is high. A typical input signal at average input power would have a corresponding scaling factor which provides minimal gain or attenuation of the signal, thereby ensuring that all signals receive AGC. Adaptively changing the scaling factor provides a technical advantage of preventing oscillation of the voice signal.

Output scaler 30 is coupled to gain/attenuation look-up table 28. Output scaler 30 is also coupled to bass band equalizer 16 which provides the equalized input signal to output scaler 30. Output scaler 30 applies the previously determined scaling factor from gain/attenuation look-up table 28 to accordingly amplify or attenuate the equalized input signal. Output scaler 30 provides the amplified signal to output 14.

Also shown in FIG. 1 is transparent path 32. Transparent path 32 is coupled to input 12 and enhancement disable position 34 of switch 26. Variable attenuator 36 is located between the ends of transparent path 32. Variable attenuator 36 can be included in voice enhancer 10 to provide enhanced noise suppression when voice enhancer 10 detects silence at input 12. When silence is detected, switch 26 is placed at enhancement disable position 34, and the path between input 12 and output 14 is by transparent path 32.

Upon switching to transparent path 32, variable attenuator 36 is set for minimum attenuation. Over a period of time each signal below the voice threshold causes the attenuation in variable attenuator 36 to increase (for example, 0.5 decibels per 3 milliseconds) toward a maximum value for variable attenuator 36. Increasing the attenuation of variable attenuator 36 causes the background noises of the network to be suppressed. This provides the technical advantage of minimizing the level of background noises during periods of silence.

As the level of the input signals increase, the attenuation of variable attenuator 36 decreases towards minimum attenuation. After a short period of integration (for example, 3 samples of the input signal) of input signals above the predetermined threshold, switch 26 moves back to its default position allowing for adaptive gain control of the input signals. Variable attenuator 36 is then reset to minimum attenuation.

It is noted that the functional blocks depicted in FIG. 1 may be embodied in separate discrete devices or in a single integrated circuit without departing from the inventive concepts of the present invention. Additionally, it is noted that the functional blocks depicted in FIG. 1 may be implemented in whole or in part in software as well as in hardware.

The operation of voice enhancer 10 of FIG. 1 will be discussed in connection with the flowchart of FIG. 2 and the representative signals of FIGS. 3a through 3d.

Figure 2:
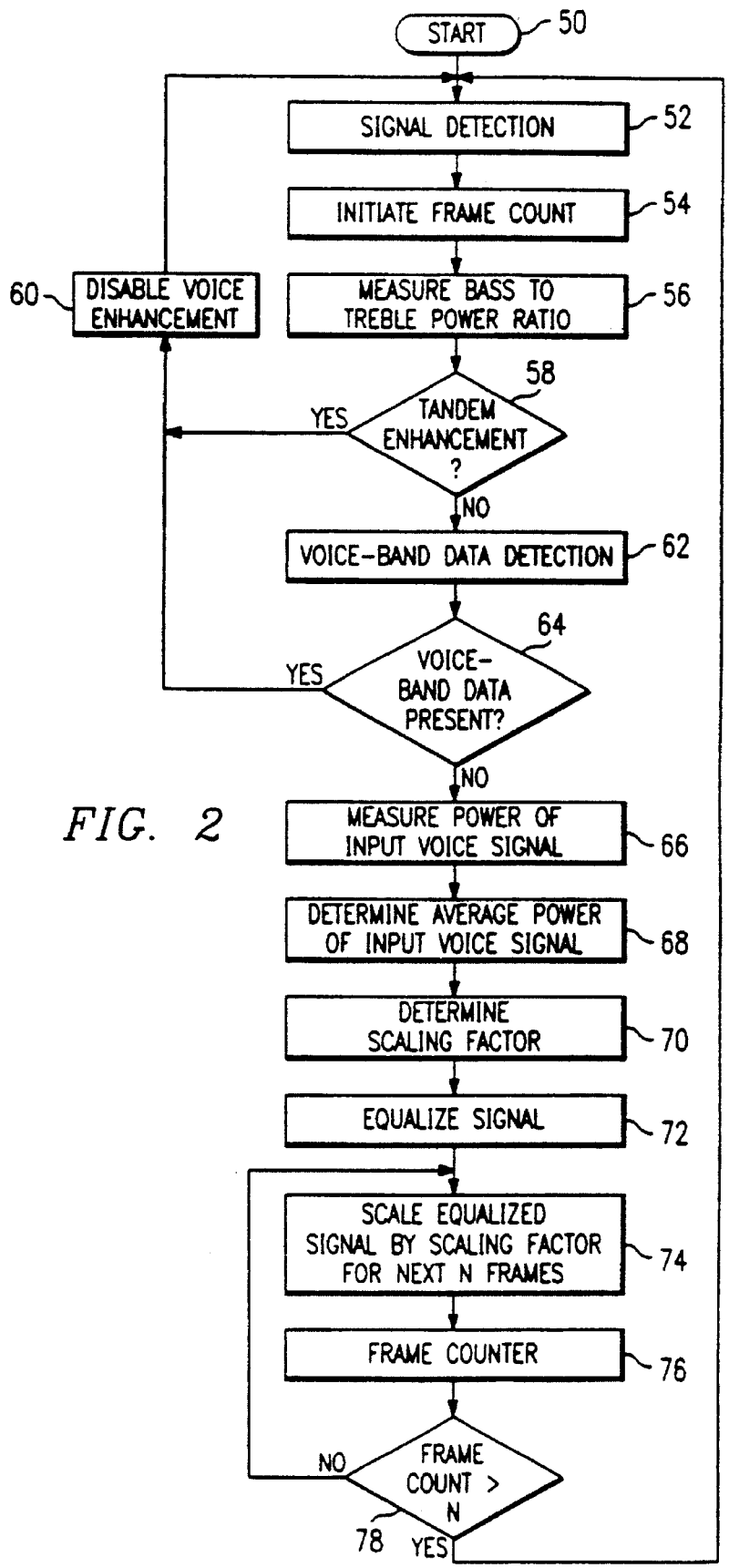
FIG. 2 shows a representative flow chart of the steps executed by the adaptive gain control circuitry for voice enhancement.

FIG. 2 depicts representative steps executed by voice enhancer 10 of the present invention for AGC of an input voice signal. The flow begins at step 50, and at step 52, the present voice enhancement process is initiated when an input signal greater than a predetermined threshold is detected. Below the predetermined threshold silence is declared to exist on input 12, and switch 26 of voice enhancer 10 is placed in enhancement disable position 34. An example for the predetermined threshold is 0.40 dBm0, but it can also be adaptively changed based on quiescent noise levels in the network or on the power level of the input voice signal. When silence is detected and switch 26 is placed in enhancement disable position 34, the input signal is provided to output 14 without scaling. This provides the technical advantage of preventing the amplification of network background noise during periods of silence. Any of the blocks associated with the input side of voice enhancer 10 (bass band equalizer 16, power averager 18, bass to treble power comparator 20, or voice-band data detector 22) can be used for detection of silence and an input voice signal.

Upon the detection of an input signal, a frame count is initiated at step 54. A frame system is used by voice enhancer 10 to divide up the transmission of signals into periods of time. A typical frame period used in voice enhancer 10 correspond to 3 milliseconds.

Once an input voice signal has been detected at input 12, then at step 56 voice enhancer 10 determines whether the input signal has been previously enhanced. As described in conjunction with FIG. 1 above, for an average speech signal, the bass to treble power ratio is roughly within a predetermined range. At step 56, bass to treble power comparator 20 measures the bass to treble power ratio to determine whether it is consistent with a previously enhanced signal indicating that a tandem configuration exists. At step 58 a decision is made as to whether the tandem enhancement is present. If a tandem enhancement is present, then the flow proceeds to step 60 where AGC voice enhancement is disabled by AGC enhancement disable 24 by sending an appropriate signal to switch 26 or its equivalent so that switch 26 will be moved to its enhancement disable position 34 (See FIG. 1). Since switch 26 is preset at a default position enabling voice enhancement, then if a tandem configuration is not detected at step 58, the flow proceeds to step 62.

At step 62 the presence of voice-band data is detected. Voice-band data detector 22 implements well-known voice-band data detection methods which need not be discussed in detail. At step 64 a query is made as to whether voice-band data is present in the input signal. If voice-band data detector 22 senses the transmission of voice-band data at input 12, then at step 64 it sends an appropriate signal to AGC enhancement disable 24, which causes switch 26 or its equivalent to move to enhancement disable position 34 at step 60. If voice-band data is not present at step 64, then the flow proceeds to step 66.

It is noted that a detection of a tandem configuration by measuring the bass to treble power ratio at step 56, and the detection of the transmission of voice-band data at step 62, can occur either simultaneously or in reverse order to that which is depicted in FIG. 2. It is also noted that the default position of switch 26 or its equivalent is to enable voice signal enhancement with the inventive concepts of the present invention. Upon detection of a previously enhanced signal or voice-band data will voice enhancement circuitry 10 be disabled at switch 26.

At step 66, power averager 18 measures the power of the input signal, and at step 68, the power averager 18 determines the average power of the input signal. At step 70, power averager 18 sends a signal representative of the measured averaged power to gain/attenuation look-up table 28. At step 70, gain/attenuation look-up table 28 provides a gain/attenuation factor or scaling factor based on the measured average input power. The scaling factor is related to the measured average power as previously described, wherein an input signal with a high average power corresponds to a low or attenuating scaling factor, and a low level input signal corresponds to an amplifying scaling factor. At step 72, bass band equalizer 16 equalizes the input voice signal.

FIG. 3a shows an example of a representative input voice signal. X-axis 100 is the frequency of the input signal, and Y axis 102 is the amplitude of the input signal in decibels (dB). Input signal 104 has associated with it a bass region 106 and treble region 108. Typically the demarcation between bass region 106 and treble region 108 is viewed as being 300 Hz on line 109, although other demarcation lines may be suitable. Bass region 106 of input signal 104 has been attenuated relative to treble region 108 by either or both an input telephone set and the channel bank of a central office .

FIG. 3b illustrates transfer function 110 applied by bass band equalizer 16 in step 72 to equalize input signal 104. It is noted that transfer signal 110 decreases the amplitude of treble portion 108 of the input signal relative to bass region 106 of input signal 104.

FIG. 3c depicts equalized signal 113 which is signal 104 following equalization at step 72 in bass band equalizer 16. Following equalization in bass band equalizer 16 by transfer function 110, equalized signal 113 has a relatively flat amplitude over the entire frequency range of the signal. It is noted that the determination of the scaling factor at step 70 and the equalization of the input signal at step 72 can occur simultaneously or in the reverse order to that depicted in FIG. 2.

The flow then proceeds to step 74 where scaling of the equalized signal 113 occurs. Output scaler 30 applies the scaling factor to equalized signal 113.

FIG. 3d illustrates two representative scaled output signals, wherein signal 114 shows equalized signal 113 following a positive or amplifying scaling factor, and signal 116 represents equalized signal 113 following a negative or attenuating scaling factor.

Following the application of the scaling factor to the input signal, the process proceeds to frame counter step 76. To avoid changing scaling factors too quickly, the scaling factor is adjusted every N frames with a maximum change of X dB, wherein for example, N could be 24 which corresponds to 3 milliseconds and X could be 0.5 dB. Therefore, the frame counter is incremented at step 76, and at step 78 it is determined whether a number of frames have passed which exceed N. If they have not, then the flow returns to step 74 where the same scaling factor previously determined is applied to the input signal until the frame count exceeds N. At step 78, if the number of frames exceeds N, the flow returns to step 52 where the entire process is begun again. This prevents a scaling factor from changing too quickly.

It is noted that the flow of FIG. 2 allows for continuous adaptive gain control (AGC) of the input signal. The scaling factor is redetermined every N frames of signal transmission allowing for changing the gain of the input signal as the input signal changes. It is also noted that methodology described in association with FIGS. 2 and 3a–3d is representative of a possible embodiment of the present invention, and that other embodiments are possible without departing from the inventive concepts of the present invention.

Figure 4:
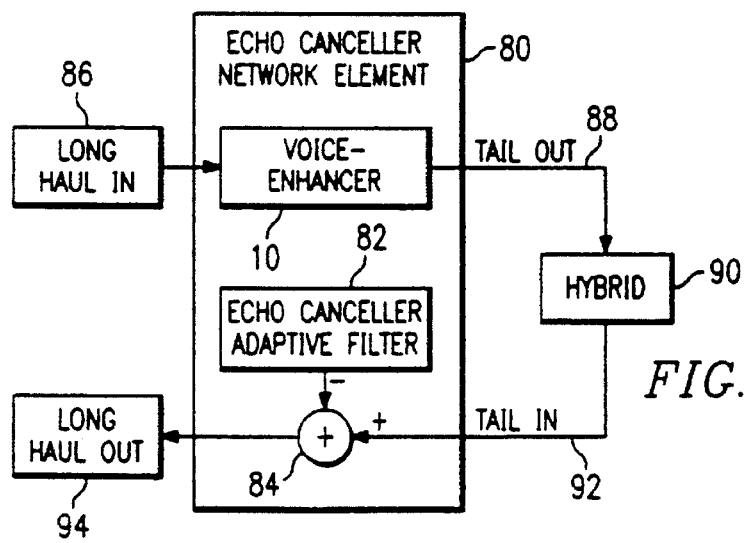
FIG. 4 is a block diagram depicting a possible location of the voice enhancement system of the present invention within a telecommunication network.

FIG. 4 shows a block diagram of an embodiment of voice enhancer 10 in echo canceller network element 80 in a typical telecommunications network. An example of echo canceller network element 80 is EC24 echo canceller manufactured and sold by DSC Communications Corporation.

Voice enhancer 10 is shown in echo canceller network element 80 coupled to long haul input 86, which provides the input voice signals being processed in echo canceller network element 80. Voice enhancer 10 performs the necessary AGC scaling of the input voice signal as described in conjunction with FIGS. 1 through 3d above, and provides on tail out 88 the enhanced signals to hybrid 90. Hybrid 90 is coupled by tail in 92 to echo canceller adaptive filter 82 through summing circuitry 84. Summing circuitry 84 provides the output signals to long haul output 94. The operation of echo canceller element 80 to eliminate echoing effects in a two-way transmission line are well known in the art and will not be discussed herein. It is also noted that voice enhancer 10 does not have to be placed in echo canceller network element 80 as other elements within a telecommunications network are suitable locations for voice enhancer 10. It is noted that echo canceller network element 80 including voice enhancer 10 may be located in or separately from a telephone switch.

Figure 5:
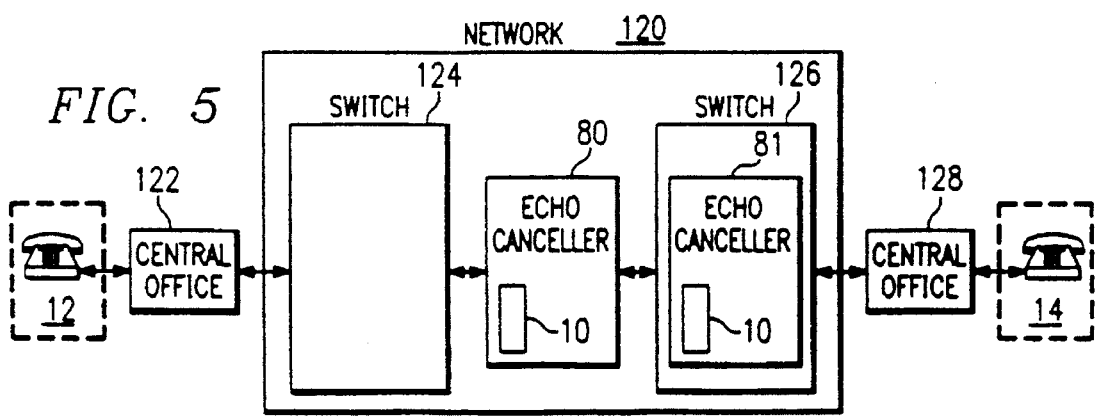
FIG. 5 is a block diagram of a telecommunications network incorporating the adaptive gain control system for voice enhancement of the present invention.

FIG. 5 shows telecommunications network 120 which is an example of a network which may incorporate the AGC voice enhancement system of the present invention to provide an improved voice signal transmission from input 12 to output 14. Input 12 includes an input telephone set which is coupled to central office 122. Central office 122 converts the analog voice signals to digital signals in a channel bank. Central office 122 provides coupling to telephone switch 124. Switch 124 is coupled to echo canceller network element 80 where voice enhancer 10 is included. Echo canceller element 80 is coupled to switch 126 and possibly others. Switch 126 shows an embodiment where echo canceller network element 81, including voice enhancer 10, is located within the switch rather than external to it. Either location of voice enhancer 10 can be employed without departing from its inventive concepts. Switch 126 is coupled to central office 128 which in turn provides coupling to output 14. The functionality of AGC voice enhancer 10 in echo cancellers 80 and 81 of network 120 is as previously described. It is noted that input 12 and output 14 will change roles as the telephone conversation progresses, thereby providing a two-way communication link between input 12 and output 14. It is noted that the embodiment of voice enhancer 10 in echo canceller network elements 80 and 81 is by way of an example of locations for voice enhancer 10 of the present invention.

In operation of voice enhancer 10 of the present invention, an input voice signal is received on input 12. Bass band equalizer 16 equalizes the input signal by attenuating the treble portion of the input signal. This essentially equalizes the signal which has previously had its bass region attenuated by various elements of the network. Power averager 18 measures and determines the average power of the input signal. Gain/attenuation look-up table 28 provides a scaling factor to be applied to the input signal based on the measured average power. Output scaler 30 applies the scaling factor to the equalized signal and supplies the scaled signal to output 14. The scaling factor is continuously updated so as the level of the input signal changes so does the scaling factor. This provides for adaptively gain controlling the voice signal. The default mode of voice enhancer 10 is to provide voice enhancement to the voice signal.

Voice-band data detector 22 analyzes the input signal to determine whether it includes voice-band data as opposed to a standard voice signal. Bass to treble power comparator 20 measures the power ratio of the bass portion to the treble portion of the input signal to determine if the signal has been previously enhanced in the network. If either previous enhancement or voice-band data is detected, then AGC enhancement disable 24 will cause switch 26 to decoupling the enhanced voice signal from output 14.

Therefore, the AGC voice enhancement system of the present invention provides for adaptive gain control by applying a scaling factor to an input voice signal and amplifying/attenuating the input voice signal to provide a more representative signal of the speaker's voice at the receiving telephone set. The present invention eliminates problems associated with prior fixed gain voice enhancement systems by continually and adaptively monitoring the input signal and appropriately scaling the input signal. Changes in the input signal are responded to so that when the input signal is received at the output receiving telephone set, a truer representation of the input voice signal is obtained.

Although the present invention has been described in detail, it should be understood that various changes, substitutions and alterations can be made hereto without departing from the spirit and scope of the invention as defined by the appended claims.

What is claimed is:

1. A method for providing voice enhancement in a telecommunications network, comprising the steps of:

determining the average power of an input voice-band signal;

determining a scaling factor in response to the average power of the input voice-band signal;

equalizing the input voice-band signal by attenuating a predetermined portion of the input voice signal;

scaling the equalized input voice-band signal with the scaling factor;

coupling the scaled voice-band signal to an output; and wherein said determining a scaling factor step further comprises the step of limiting the amount of change between consecutive scaling factors.

2. The method of claim 1 further comprising the steps of:

detecting voice-band data in the input signal; and decoupling the scaled voice-band signal from the output.

3. The method of claim 1 further comprising the steps of:

detecting tandem enhancement in the network; and decoupling the scaled voice-band signal from the output.

4. A method for providing voice enhancement in a telecommunications network, comprising the steps of:

determining the average power of an input voice-band signal;

determining a scaling factor in response to the average power of the input voice-band signal;

equalizing the input voice-band signal by attenuating a predetermined portion of the input voice signal;

scaling the equalized input voice-band signal with the scaling factor;

coupling the scaled voice-band signal to an output;

detecting at least one of voice-band data in the input signal and tandem enhancement in the network; and decoupling the scaled voice-band signal from the output.

5. The method of claim 1 wherein said determining the average power, determining a scaling factor, equalizing, scaling, and coupling steps are performed in an echo canceller of a telecommunications network.

6. The method of claim 1 wherein the predetermined portion of the input voice-band signal is above substantially 300 Hz.

7. The method of claim 1 wherein the predetermined portion of the input voice-band signal is above substantially 400 Hz.

8. The method of claim 1 wherein said scaling the input signal step further comprises using the scaling factor for scaling the equalized input signal for a predetermined period of time.

9. The method of claim 1 further comprising the steps of:
dividing the input voice-band signal into a plurality of frames, each frame representative of a period of time; and
scaling the equalized input signal with the scaling factor for a predetermined number of frames.

10. The method of claim 1 wherein said equalizing step further comprises filtering the input signal such that the power of the input signal above a predetermined frequency is attenuated.

11. The method of claim 1 wherein said determining the average power step further comprises low pass filtering a rectified input voice-band signal.

12. A method for providing voice enhancement in a telecommunications network, comprising the steps of:
determining the average power of an input voice-band signal;
determining a scaling factor in response to the average power of the input voice-band signal;
equalizing the input voice-band signal by attenuating a predetermined portion of the input voice signal;
scaling the equalized input voice-band signal with the scaling factor;
coupling the scaled voice-band signal to an output;
comparing the determined average power of the input voice-band signal to power measurements expected for a previously scaled signal; and
decoupling the scaled voice-band signal from the output in response to said comparing step.

13. The method of claim 1 further comprising the steps of:
dividing the input voice-band signal into a plurality of frames, each frame representative of a period of time;
continuously performing said determining the average power, determining a scaling factor, equalizing, scaling, and coupling steps upon the expiration of a predetermined number of frames.

14. A method for providing voice enhancement in a telecommunications network, comprising the steps of:
determining the average power of an input voice-band signal;
determining a scaling factor in response to the average power of the input voice-band signal;
equalizing the input voice-band signal by attenuating a predetermined portion of the input voice signal;
scaling the equalized input voice-band signal with the scaling factor
coupling the scaled voice-band signal to an output;
detecting periods of silence in the input voice-band signal at the input; and
decoupling the scaled voice-band signal from the output.

15. The method of claim 14 further comprising the step of attenuating the input voice-band signal so that the noise level of the detected periods of silence is minimized.

16. A method for providing voice enhancement in a telecommunications network, comprising the steps of:
determining the average power of an input voice-band signal;
determining a scaling factor in response to the average power of the input voice-band signal;
equalizing the input voice-band signal by attenuating a predetermined portion of the input voice-band signal;
scaling the equalized input voice-band signal with the scaling factor;
coupling the scaled voice-band signal to an output; and
detecting at least one of voice-band data in the input signal and tandem enhancement in the network and decoupling the scaled voice-band signal from the output.

17. The method of claim 16 wherein said determining the average power, determining a scaling factor, equalizing, scaling, and coupling steps are performed in an echo canceller of a telecommunications network.

18. The method of claim 16 wherein the predetermined portion of the input voice-band signal is above substantially 300 Hz.

19. (Amended) The method of claim 16 further comprising the steps of:
dividing the input voice-band signal into a plurality of frames, each frame representative of a period of time; and
scaling the equalized input signal with the scaling factor for a predetermined number of frames.

20. The method of claim 16 further comprising the steps of:
dividing the input voice-band signal into a plurality of frames, each frame representative of a period of time;
continuously performing said determining the average power, determining a scaling factor, equalizing scaling and coupling steps upon the expiration of a predetermined number of frames.

21. The method of claim 16 further comprising the steps of:
detecting periods of silence in the input voice-band signal at the input; and
decoupling the scaled voice-band signal from the output.

22. The method of claim 21 further comprising the step of attenuating the input voice-band signal so that the level of the detected periods of silence is minimized.

23. A system for providing enhancement to a voice-band signal in a telecommunications network, comprising:
a power averager for determining the average power of the voice-band signal;
an equalizer for attenuating a predetermined portion of the voice-band signal; and
an output scaler for scaling the equalized voice-band signal with a scaling factor in response to the determined average power, and wherein said output scaler is further operable to limit the amount of change between consecutive scaling factors.

24. The system of claim 23 further comprising a voice-band data detector for detecting voice-band data in the voice-band signal and preventing said output scaler from scaling the voice-band signal.

25. The system of claim 23 further comprising a tandem voice enhancement detector for detecting when the voice-band signal has been previously scaled and preventing said output scaler from scaling the voice-band signal.

26. The system of claim 23 further comprising:
a voice-band data detector for detecting voice-band data in the voice-band signal;
a tandem voice enhancement detector for detecting when the voice-band signal has been previously scaled; and
wherein at least one of said voice-band data detector and said tandem voice enhancement detector is operable to prevent said output scaler from scaling the voice-band signal.

27. The system of claim 23 wherein said power averager, equalizer, and output scaler are located in an echo canceller of a telecommunications network.

28. The system of claim 23 wherein the predetermined portion of the voice-band signal attenuated by said equalizer is above substantially 300 Hz.

29. The system of claim 23 wherein the predetermined portion of the voice-band signal attenuated by said equalizer is above substantially 400 Hz.

30. The system of claim 23 wherein said output scaler is operable to scale equalized voice-band signals with a previously determined scaling factor for a predetermined period of time.

31. The system of claim 23 wherein said output scaler is further operable to divide the voice-band signal into a plurality of frames, each frame representative of a period of time, and to scale the voice-band signal for a predetermined number of frames.

32. The system of claim 23 wherein said equalizer comprises a digital filter operable to filter the voice-band signal above a predetermined frequency.

33. The system of claim 23 wherein said power averager comprises a low pass filter.

34. A system for providing enhancement to a voice-band signal in a telecommunications network, comprising:
   a power averager for determining the average power of the voice-band signal;
   an equalizer for attenuating a predetermined portion of the voice-band signal;
   an output scaler for scaling the equalized voice-band signal with a scaling factor in response to the determined average power; and
   a gain/attenuation look-up table for providing the scaling factor to be used by said output scaler in scaling the voice-band signal.

35. A system for providing enhancement to a voice-band signal in a telecommunications network, comprising:
   a power averager for determining the average power of the voice-band signal;
   an equalizer for attenuating a predetermined portion of the voice-band signal;
   an output scaler for scaling the equalized voice-band signal with a scaling factor in response to the determined average power; and
   a gain/attenuation look-up table for providing the scaling factor to be used by said output scaler in scaling the voice-band signal, and wherein said gain/attenuation look-up table is organized such that low power voice-band signals are assigned large scaling factors relative to high power voice-band signals, the high power voice-band signals being assigned low or negative scaling factors.

36. A system for providing enhancement to a voice-band signal in a telecommunications network, comprising:
   a power averager for determining the average power of the voice-band signal;
   an equalizer for attenuating a predetermined portion of the voice-band signal;
   an output scaler for scaling the equalized voice-band signal with a scaling factor in response to the determined average power;
   a transparent path for providing the input voice-band signal directly to an output so that the input voice-band signal avoids scaling; and
   an attenuator coupled in said transparent path for variably attenuating the input voice-band signal during periods of silence in the input voice-band signal.

37. A system for providing enhancement to a voice-band signal in a telecommunications network, comprising:
   an input for accepting the voice-band signal;
   an output for receiving the voice-band signal; and
   a coupling between said input and output including a voice enhancer, said voice enhancer comprising:
      a power averager for determining the average power of the voice-band signal;
      an equalizer for attenuating a predetermined portion of the voice-band signal; and
      an output scaler coupled to said output for scaling the equalized voice-band signal with a scaling factor in response to the determined average power and providing the scaled signal to said output, and wherein said output scaler is further operable to limit the amount of change between consecutive scaling factors.

38. The system of claim 37 further comprising a voice-band data detector for detecting voice-band data in the voice-band signal and for decoupling said output scaler from said output.

39. The system of claim 37 further comprising a tandem voice enhancement detector for detecting when the voice-band signal has been previously scaled and for decoupling said output scaling circuitry from said output.

40. A system for providing enhancement to a voice-band signal in a telecommunications network, comprising:
   an input for accepting the voice-band signal;
   an output for receiving the voice-band signal; and
   a coupling between said input and output including a voice enhancer, said voice enhancer comprising:
      a power averager for determining the average power of the voice-band signal;
      an equalizer for attenuating a predetermined portion of the voice-band signal;
      an output scaler coupled to said output for scaling the equalized voice-band signal with a scaling factor in response to the determined average power and providing the scaled signal to said output;
      a voice-band data detector for detecting voice-band data in the voice-band signal;
      a tandem voice enhancement detector for detecting when the voice-band signal has been previously scaled; and
      wherein at least one of said voice-band data detector and said tandem voice enhancement detector being operable to decouple said output scaler from said output.

* * * * *